United States Patent
Liu

(10) Patent No.: US 7,057,449 B1
(45) Date of Patent: Jun. 6, 2006

(54) NOISE CANCELLATION IN MIXED SIGNAL ENVIRONMENT

(75) Inventor: Edward W. Liu, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 547 days.

(21) Appl. No.: 08/840,947

(22) Filed: Apr. 21, 1997

(51) Int. Cl.
*H03K 5/00* (2006.01)

(52) U.S. Cl. ...................................... 327/551; 327/311
(58) Field of Classification Search ................ 327/379, 327/384, 310, 311, 551, 552, 34, 294, 361, 327/355; 379/390
See application file for complete search history.

(56) References Cited

U.S. PATENT DOCUMENTS

| | | | | | |
|---|---|---|---|---|---|
| 5,038,215 | A | * | 8/1991 | Hadfield | ...................... 358/150 |
| 5,546,458 | A | * | 8/1996 | Iwami | ......................... 379/390 |
| 5,648,660 | A | | 7/1997 | Lee et al. | .............. 250/370.09 |

FOREIGN PATENT DOCUMENTS

| | | | | |
|---|---|---|---|---|
| JP | 61201598 | A | * | 9/1986 |
| JP | 402104037 | | * | 4/1990 |
| JP | 406022007 | A | * | 1/1994 |
| JP | 8154057 | | | 6/1996 |
| JP | 408317289 | | * | 11/1996 |
| JP | 410107700 | | * | 4/1998 |

OTHER PUBLICATIONS

IBM Techicla Disclosure Bulletin (Vol. 28, No. 9, Feb. 1986, pp. 3981–3982), Feb. 1986.*
JP 8154057, English Abstract –Author(s) –Hironori, Terasawa.

* cited by examiner

*Primary Examiner*—Dinh T. Le
(74) *Attorney, Agent, or Firm*—Mitchell Silberberg and Knupp LLP

(57) ABSTRACT

A method of canceling noise in analog circuits is described along with noise cancellation circuits. Analog circuits are sensitive to noise. Especially in mixed signal environments where digital circuits and analog circuits are combined, the noise generated by relatively noisy digital circuits often cause the analog circuits to produce incorrect output signals. Instead of shielding or separating the susceptible analog circuits from noisy digital circuits, additional circuitry is added where one of the added circuits, denoted as the noise separator circuit, produce only the noise component of the output signal, the first output, of the analog circuit adversely affected by the noise. Then, another circuit is used to subtract the noise from the first output, thereby producing a noise-free output signal. Alternatively, the noise separator circuit can be made to produce the inverse of the first output, including the inverse of the noise. Then, the first output and the inverse output can be added and halved to produce the desired, noise-free output.

4 Claims, 2 Drawing Sheets

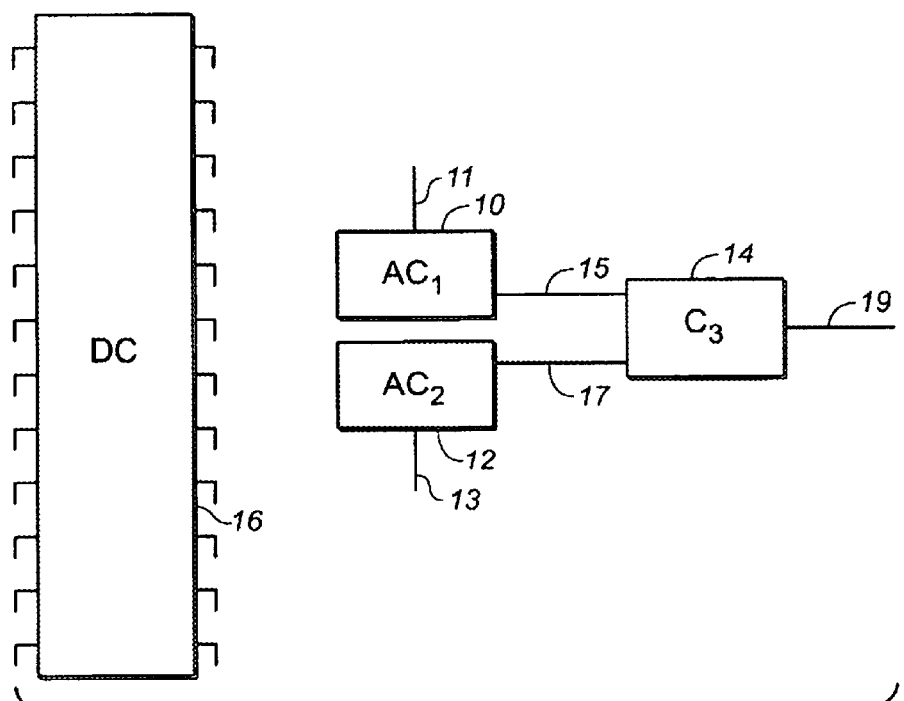
FIG._1
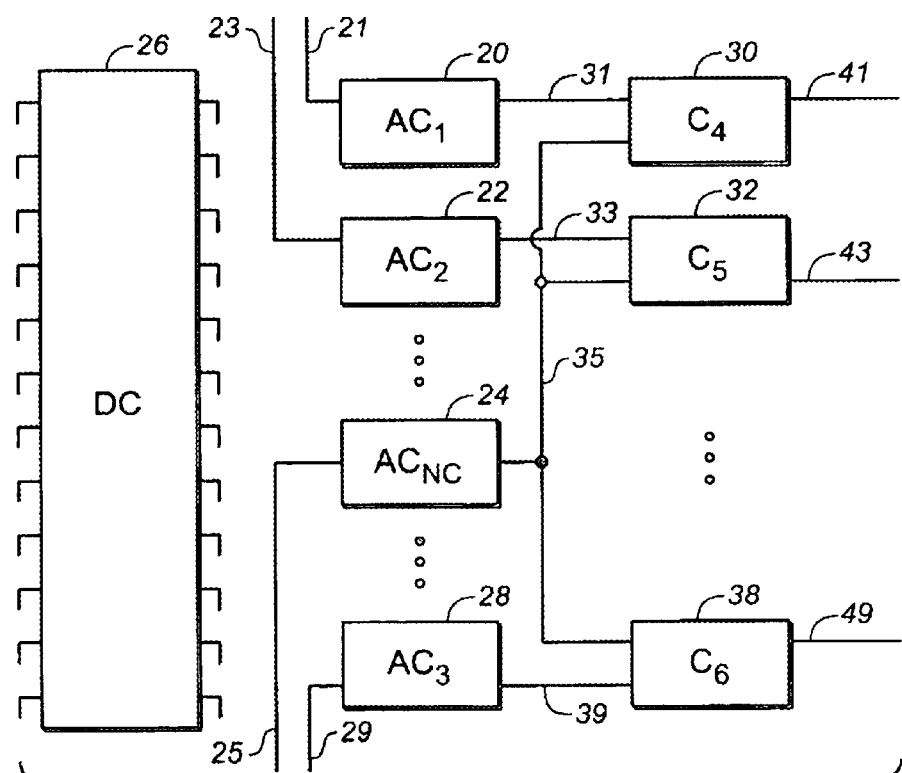
FIG._2

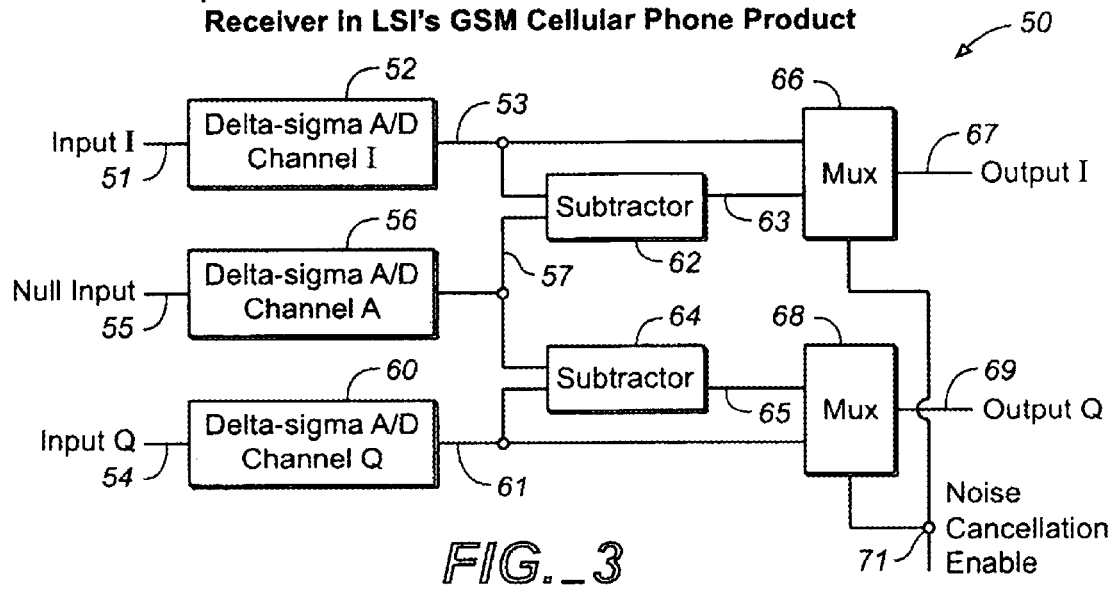
FIG._3
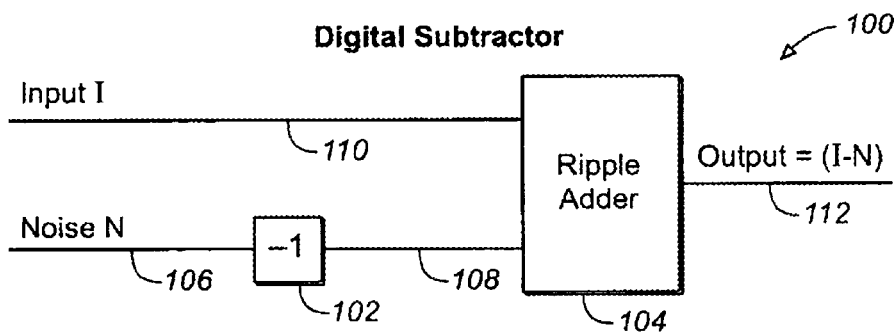
FIG._4A
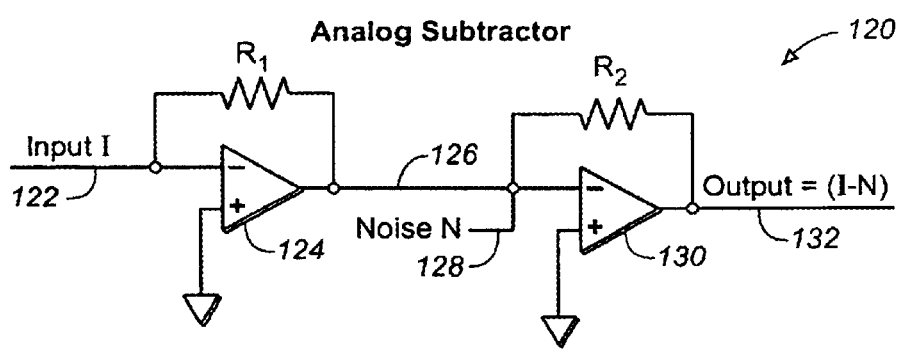
FIG._4B

NOISE CANCELLATION IN MIXED SIGNAL ENVIRONMENT

BACKGROUND OF THE INVENTION

1. Field of the Invention

The present invention generally relates to the art of processing electrical signals. In particular, the present invention relates to the art of noise cancellation in analog circuits.

2. Description of Related Art

Many integrated circuit (IC) devices include both digital circuits and analog circuits. Such an IC is referred to as a mixed-signal integrated circuit (MSIC). The application of the MSIC is most prevalent for IC's used in the multimedia and communications devices such as wireless communication systems, or cellular telephones. Even in mostly digital circuit IC's, analog circuits are used to achieve functions not realizable or difficult to implement using purely digital circuits.

Even though the use of analog circuits may be advantageous in many designs, the IC industry has been attempting to minimize the use of analog circuits for IC chips having digital circuits because of the susceptibility of the analog circuits to noise generated by the digital circuits. Digital circuits, especially the larger digital circuits prevalent in the industry, are very noisy relative to typical analog circuits surrounding the digital circuit. The analog circuits may fail due to the noise generated by the digital circuits.

Moreover, increasing miniaturization of electronic devices, especially in the communications market, has required the IC chips to become even more tightly integrated. Consequently, the circuits comprising the IC chips, both digital and analog, are being fabricated close to each other, thereby aggravating the negative effects of the noise.

Previous attempts to alleviate the problem focused on the method of shielding circuit blocks of an IC or focused on isolating the circuits of the IC. For example, the U.S. Pat. No. 4,628,343, entitled "Semiconductor Integrated Circuit Device Free From Mutual Interference Between Circuit Blocks Formed Therein," issued to Yuji Komatsu, discloses an IC where "the first and second circuit blocks are shielded electrically from each other on the surface of the semiconductor chip." Col. 2 ll. 27–30, the Komatsu reference. In the U.S. Pat. No. 5,453,713, entitled "Noise-Free Islands in Digital Integrated Circuits," issued to Hamid Partovi and Andrew J. Barber, the "integrated circuit chip has both digital and analog circuit functions, with one or more islands for isolating the analog functions from noise caused by the digital functions." Abstract, the Partovi and Barber reference. However, in tightly integrated, compact IC packages, shielding or isolation techniques may not be desirable, sufficient, or even feasible.

SUMMARY OF THE INVENTION

These problems are addressed by apparatuses and methods according to the present invention.

According to one embodiment of the present invention, there is provided a circuit comprising a first analog circuit, a second analog circuit, and a third circuit. An input signal is processed by the first circuit and results in an output signal which is the function of the first circuit and noise. The second analog circuit is configured to produce the noise component of the output signal from the first circuit. The third circuit is used to subtract the noise component from the output signal from the first circuit, resulting in the noise-free signal.

In order for the second circuit to produce a similar noise signal compared to the noise component of the first circuit, the second circuit is placed proximal to the first circuit. Also, the noise cancellation techniques of the present invention are most useful in mixed signal environments where analog and digital circuits are located near each other.

According to another embodiment of the present invention, there is provided a circuit comprising a first analog circuit, a second analog circuit, and a third circuit. An input signal is processed by the first circuit and results in an output signal which is the function of the first circuit and noise. The second analog circuit is configured to produced a signal which is inverse of the output of the first circuit. The third circuit is used first to subtract the output from the second circuit from the output signal from the first circuit, and second to halve the resultant. Then, the final output from the third circuit is the noise-free output portion of the first circuit.

The above-summarized techniques can be applied to multiple analog circuits.

According to another embodiment of the invention, a noise cancellation method is disclosed. First, an input signal is supplied to a first analog circuit. Second, the output from the first circuit is read. Third, a null input signal is supplied to a second analog circuit located proximal to said first analog circuit. Fourth, the output from the second analog circuit is read. Finally, the two outputs are combined to produce a signal which is the first output signal without the noise component.

These and other aspects, features, and advantages of the present invention will be apparent to those persons having ordinary skilled in the art to which the present invention relates from the foregoing description and the accompanying drawings.

BRIEF DESCRIPTION OF THE DRAWINGS

FIG. 1 is a block diagram illustrating an embodiment of the present invention;

FIG. 2 is a block diagram illustrating another embodiment of the present invention;

FIG. 3 is a block diagram illustrating yet another embodiment of the present invention; and FIG. 4A is a block diagram illustrating a digital subtractor; and FIG. 4B is a block diagram illustrating an analog subtractor.

DETAILED DESCRIPTION OF THE PREFERRED EMBODIMENT(S)

Referring to the drawings, particularly to FIG. 1, a first analog circuit 10 processes input signal 11, denoted $S_{11}$, and produces an output signal 15, $S_{15}$. The function of the first circuit 10 can be represented as:

$$S_{15}=F_{10}(S_{11})$$

where $S_{nn}$ represents the signal for the line nn and $F_{nn}$ represents the function of circuit nn. This output signal $F_{10}(S_{11})$, a function of the input signal 11, $S_{11}$, as processed by the first circuit 10, is the desired output of the circuit 10. However, due to noise, especially from a noisy digital circuit 16 in this case, the actual output of the circuit 10, at signal line 15, is:

$$S_{15}=F_{10}(S_{11})+N_{10}$$

where $N_{10}$ is the noise component at the signal line 15 and represents the unwanted signal produced by circuit 10 due to the effects of the noise. Here, $N_{nn}$ represents the noise component of the output signal of circuit nn.

The digital circuit 16 can be, but not necessarily, connected to the first circuit.

The second circuit 12 and the third circuit 14 is provided to eliminate the effect of the noise, $N_{10}$, of the circuit 10, thereby producing the desired, a noise free, signal $F_{10}(S_{11})$ as the output at line 19.

Implementation 1

To eliminate the noise, N, a second analog circuit 12 and a third circuit 14 are added. The second circuit 12 is typically identical in design to the first circuit 10 and placed proximal to the first circuit 10 so as to experience the same noise affecting the first circuit 10. However, the input signal 13, $S_{13}$, to the second circuit 12 is designed to produce a null output relative to the circuit. A null output of the second circuit 12 is an output, absent the effects of noise, which can be added to or subtracted from the output of the first circuit 10 without effecting the value of the output of the first circuit. The null output may mean a zero voltage output as the output signal line 17, $S_{17}$, a zero current output signal $S_{17}$, or any other output which, when added to or subtracted from output signal 15, will not change the signal 15. To simplify the discussion, the null output will be assumed to be zero. Alternatively expressed, we design the second input signal 13 to produce an output signal 17 such that $$S_{17} = F_{12}(S_{13}) = 0 = \text{zero}.$$

Because the second circuit 12 is an identically designed circuit to the first circuit 10, the function of the second circuit, $F_{12}$, is identical in design to the function of the first circuit, $F_{10}$. Alternatively expressed, $$F_{10} = F_{12}.$$

However, as with the first circuit 10, the effect of the noise will produce the following output signal 17, therefore, the actual value of the signal at line 17, $S_{17}$ is:

$$\begin{aligned} S_{17} &= F_{12}(S_{13}) + N_{12} \\ &= 0 + N_{12} \\ &= N_{12}. \end{aligned}$$

Therefore, the second circuit 12 may also be called a noise separator circuit.

Because the second circuit 12 is identical in design to the first circuit 10, and because the second circuit 12 experiences the same noise as the first circuit, the noise $N_{12}$ can be equated to $N_{10}$, $$N_{10} = N_{12}.$$

The third circuit 14 subtracts the output signal 17 from the output signal 15 to produce the desired, a noise free output of the function $F_{10}$ in response to signal $S_{11}$, $F_{10}(S_{11})$. Alternatively, the function of the third circuit 14 can be expressed as follows:

$$\begin{aligned} S_{19} &= \text{the output signal 19 of the third circuit 14} \\ &= S_{15} - S_{17} \\ &= (F_{10}(S_{11}) + N_{10}) - N_{12} \quad ; \text{note } N_{10} = N_{12} \\ &= F_{10}(S_{11}) + N_{10} - N_{10} \\ &= F_{10}(S_{11}). \end{aligned}$$

Accordingly, the final resultant signal, $S_{19}$ is the result of the original operations of the first circuit 10 on the input signal 11, $F_{10}(S_{11})$.

If the outputs of the first circuit 10 and the second circuit 12 are analog signals, an analog subtractor may be used. Analog subtractors are well known in the art, and FIG. 4B illustrates a simple analog subtractor 120. Referring to FIG. 4B, the incoming signal, I, 122 is inverted by the Op. Amp. 124 to produce, as the output 126, an inverted signal −I. Then, the inverted signal is added to the noise signal 128, N, and inverted again by the Op. Amp. 130. The final output 132 is the inversion of the result of −I +N. Expressed mathematically, $$\text{Output} = -(-I + N) = I - N$$

Implementation 2

In Implementation 1, the second circuit 12 was used to produce the noise $N_{10}$, and the third circuit 14 was used to subtract the noise from the output signal 15. Alternatively, the second circuit 12 can be designed to produce an output signal which is an inverse of the output signal of the first circuit 12. That is, the input signal 13 to the second circuit 12 can be set to be inverse of the input signal 11 to the first circuit 10. Simply put, $$S_{13} = -S_{11}.$$

Because the second circuit 12 is identical in design to the first circuit 10, the output signal 17 from the second circuit 12 would be the inverse of the output signal 15 plus noise. Alternatively expressed, $$\begin{aligned} S_{17} &= F_{12}(S_{13}) + N_{12} \quad ; \text{replacing } S_{13} = -S_{11}, F_{12} = F_{10}, \text{ and} \\ & \qquad\qquad\qquad\qquad N_{12} = N_{10} \\ &= F_{10}(-S_{11}) + N_{10} \\ &= -F_{10}(S_{11}) + N_{10}. \end{aligned}$$

If the third circuit 14 is designed to subtract $S_{17}$ from $S_{15}$, then $S_{19}$ is:

$$\begin{aligned} S_{19} &= S_{15} - S_{17} \quad ; S_{15} = F_{10}(S_{11}) + N_{10}; \text{ and} \\ & \qquad\qquad ; S_{17} = -F_{10}(S_{11}) + N_{10} \\ &= (F_{10}(S_{11}) + N_{10}) - (-F_{10}(S_{11}) + N_{10}) \\ &= F_{10}(S_{11}) + N_{10} + F_{10}(S_{11}) - N_{10} \\ &= F_{10}(S_{11}) + F_{10}(S_{11}) \\ &= 2F_{10}(S_{11}). \end{aligned}$$

The resultant signal, $S_{19}$, is the two (2) times the result of the original operations of the first circuit 10 on the input signal 11.

If the third circuit 14 further comprises circuits to half the resultant signal, then $$\begin{aligned} S_{19} &= S_{15} - S_{17} \quad ; \text{see above for operations} \\ &= 2F_{10}(S_{11})/2 \\ &= F_{10}(S_{11}). \end{aligned}$$

Again, the final resultant signal, $S_{19}$, is the result of the original operations of the first circuit 10 on the input signal 11, $F_{10}(S_{11})$.

Implementation 3

For multiple analog circuits exposed to the same environment, a single noise separator circuit can be utilized to remove the noise component of multiple analog circuits. Referring now to FIG. 2, a plurality of analog circuits 20, 22, 24, and 28 are illustrated. The inputs for the circuits 20, 22, 24, and 28 are provided by lines 21, 23, 25, and 29, and are designated as signals $S_{21}$, $S_{23}$, $S_{25}$, and $S_{29}$, respectively, in this specification. The outputs of the plurality of analog circuits 20, 22, 24, and 28 are carried by the lines 31, 33, 35, and 39, and their signals can be represented as $$S_{31}=F_{20}(S_{21})+N_{20},$$

$$S_{33}=F_{22}(S_{23})+N_{22},$$

$$S_{35}=F_{24}(S_{25})+N_{24},$$

and $$S_{39}=F_{28}(S_{29})+N_{28}.$$

Each of the output signals include a noise component. In the figure, the digital circuit 26 may be the major cause of the noise. The analog circuits, being proximally located to each other, experiences the same noise environment, and if the analog circuits are identical in design, then the noise components of their respective output signals have identical values. Alternatively expressed, $$N=N_{20}=N_{22}=N_{24}=N_{28}.$$

In such a configuration, one of the circuits can be assigned to be the noise separator circuit, and the separated noise signal can be used to cancel the noise components of the other output signals. In FIG. 2, the circuit 24 is used as the noise separator circuit. As discussed in Implementation 1 section above, signal $S_{25}$ can be designed as to produce only the noise signal at the output, $S_{35}$, of the circuit 24. Then, the subtractor circuits 30, 32, and 38 can be used to remove the noise components of the output signals of the circuits 20, 22, and 28, respectively as follows:

$$S_{41} = S_{31} - S_{35}$$
$$= (F_{20}(S_{21}) + N) - N$$
$$= F_{20}(S_{21});$$
$$S_{43} = S_{33} - S_{35}$$
$$= (F_{22}(S_{23}) + N) - N$$
$$= F_{22}(S_{23}); \text{ and}$$
$$S_{49} = S_{39} - S_{35}$$
$$= (F_{28}(S_{29}) + N) - N$$
$$= F_{28}(S_{29}).$$

Alternatively, if the noise cancellation technique as described by Implementation 2 can be implemented in the multiple analog circuit environment; however, the technique would be less effective if the input signals to the circuits, $S_{21}$, $S_{23}$, and $S_{29}$, have identical values.

A Sample Implementation

Referring now to FIG. 3, an implementation of the present invention for a baseband receiver for a cellular phone product is illustrated. The desired outputs of the entire circuit 50 are the output I 67 and the output Q 69, denoted $S_{67}$ and $S_{69}$ respectively. Signal $S_{67}$ is the "clean" resultant signal of the input signal I 51, $S_{51}$, as processed by the first circuit 52, or $F_{52}(S_{51})$. However, because of the noise, the actual output 53, $S_{53}$, of the first circuit 52 is $F_{52}(S_{51})+N_{52}$. That is, $$S_{53}=F_{52}(S_{51})+N_{52}.$$

To eliminate the noise component of the actual output $S_{53}$ of the first circuit 52, a noise separator circuit 56 is used to produced the noise only, and a subtractor circuit 62 is used to subtract the noise component, N, from the actual output 53, $S_{53}$, of the first circuit 52. In particular, the noise separator circuit 56 is fed a null, or a zero, input 55, causing the noise separator circuit 56 to produced, at its output 57, $S_{57}$, the noise component. That is, $$S_{57}=F_{56}(S_{55})+N_{56}.$$

Because $S_{55}$=null, $F_{56}(S_{55})$=0. And, because the noise separator circuit 56 is identical in design to the first circuit 52 and the noise separator circuit 56 is exposed to the same noise as the first circuit 52 due to its proximal location to the first circuit 52, the noise component of the outputs of both circuits are equal, $N_{52}=N_{56}$. Therefore, $$S_{57} = F_{56}(S_{55}) + N_{56}$$
$$= 0 + N_{52}$$
$$S_{57} = N_{52}.$$

Then, the subtractor circuit 63 is used to subtract the noise component out from $S_{53}$ by subtracting $S_{57}$ from $S_{53}$. The output 63, $S_{63}$, from the subtractor circuit 62 is $$S_{63} = S_{53} - S_{57}$$
$$= (F_{52}(S_{51}) + N_{52}) - N_{52}$$
$$= F_{52}(S_{51}).$$

A multiplexor 66 can be used to select between the noise-free signal $S_{63}$ or the actual output signal $S_{53}$ as the final output of the circuit 50. A noise-cancellation-enable line 69 can be used to switch the multiplexor 66 between the two signals.

As discussed by Implementation 3 section above, multiple circuits can share a single noise separator circuit to eliminate the noise components of their outputs. As illustrated by FIG. 3, a second circuit 60, proximal to and identical in design to the first circuit 52 and to the noise separator circuit 56, can use the output of the noise separator circuit 56 to eliminate the noise from its own output 61, $S_{61}$. However, the second circuit 60 requires the use of its own subtractor circuit 64 and its own multiplexor 68.

In the embodiment illustrated by FIG. 3, the first circuit 52, the second circuit 60, and the noise separator circuit 56 are delta-sigma analog-to-digital converters with digital outputs 53, 71, and 57, respectively. The noise cancellation technique can be used in for the digital or for the mixed signal environments as well as the analog environment.

For the embodiment of FIG. 3, the subtractors 62 and 64 must be digital subtractors. Digital subtractors are well known in the art, and FIG. 4A illustrates a simple digital subtractor 100. Referring to FIG. 4A, the noise 106 is negated by multiplying the value by −1 using a multiplier 102. The multiplier 102 is a very simple circuit to perform a 2's complement to the incoming signal, effectively flipping the incoming bits. Then, the negated noise 108 is added 104 to the input 110 to obtain an output 112, the value which is the input value minus the noise value.

Although the present invention has been described in detail with regarding the exemplary embodiments and drawings thereof, it should be apparent to those skilled in the art that various adaptations and modifications of the present invention may be accomplished without departing from the spirit and the scope of the invention. Accordingly, the invention is not limited to the precise embodiment shown in the drawings and described in detail hereinabove. Therefore, it is intended that all such variations not departing from the spirit of the invention be considered as within the scope thereof as limited solely by the claims appended hereto.

In the following claims, those elements which do not include the words "means for" are intended not to be interpreted under 35 U.S.C. §112 ¶6.

I claim:

1. A circuit comprising:

a first circuit having a first input and a first output, wherein said first output includes a function of a signal at said first input and also includes a first noise component resulting from noise experienced by said first circuit;

a second circuit having a second input and a second output;

a signal supplying to the second input a signal which is an inverse of the signal at the first input;

a third circuit having a third input connected to said first output and fourth input connected to said second output, and subtracting said second output from said first output; and a digital circuit proximal to said first circuit and to said second circuit.

2. A circuit according to claim 1, wherein said third circuit further comprises a halving circuit which inputs a signal having an input amplitude and outputs the signal at one-half the input amplitude.

3. A circuit according to claim 1, wherein said first circuit, said second circuit, said third circuit, and said digital circuit are on a single integrated circuit chip.

4. A circuit according to claim 1, wherein said second circuit is identical to said first circuit.

* * * * *